United States Patent
Bonnell et al.

(10) Patent No.: US 6,873,163 B2
(45) Date of Patent: Mar. 29, 2005

(54) SPATIALLY RESOLVED ELECTROMAGNETIC PROPERTY MEASUREMENT

(75) Inventors: Dawn A. Bonnell, Media, PA (US); Sergei V. Kalinin, Philadelphia, PA (US); Rodolfo Antonio Alvarez, Philadelphia, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 4 days.

(21) Appl. No.: 10/052,024

(22) Filed: Jan. 18, 2002

(65) Prior Publication Data

US 2003/0067308 A1 Apr. 10, 2003

Related U.S. Application Data

(60) Provisional application No. 60/262,347, filed on Jan. 18, 2001.

(51) Int. Cl.[7] .............................................. G01R 31/26
(52) U.S. Cl. ....................................... 324/719; 324/762
(58) Field of Search ............................. 73/105; 250/306, 250/307; 324/244, 713, 750, 719, 754, 762

(56) References Cited

U.S. PATENT DOCUMENTS

| | | | | |
|---|---|---|---|---|
| 5,266,801 A | | 11/1993 | Elings et al. ................ | 250/306 |
| 5,308,974 A | | 5/1994 | Elings et al. ................ | 250/234 |
| 5,465,046 A | * | 11/1995 | Campbell et al. ........... | 324/244 |
| 5,847,569 A | * | 12/1998 | Ho et al. ..................... | 324/752 |
| 6,201,401 B1 | * | 3/2001 | Hellemans et al. ......... | 324/719 |
| 6,530,266 B1 | * | 3/2003 | Adderton et al. ............ | 73/105 |
| 2002/0021139 A1 | * | 2/2002 | Jackson ....................... | 324/762 |

OTHER PUBLICATIONS

Semancik, S. et al., "Kinetically controlled chemical sensing using micromachined structures", *Acc. Chem. Res.*, 1998, 31, 279–287.

Hagfeldt, M. et al., "Molecular Photovolataics", *Acc. Chem Res.*, 2000, 33, 269–277.

Hong, B.S. et al., "Equilibrium electrical property measurements in electroceramics", *Key Engineering Materials*, 1997, (125–126),163–186.

Jiang, S.P. et al., "Electrochemical techniques in studies of solid ionic conductors", *Key Engineering Materials*, 1997, (125–126), 81–132.

(Continued)

*Primary Examiner*—N. Le
*Assistant Examiner*—Walter Benson
(74) *Attorney, Agent, or Firm*—Woodcock Washburn LLP

(57) ABSTRACT

A scanning probe detects phase changes of a cantilevered tip proximate to a sample, the oscillations of the cantilevered tip are induced by a lateral bias applied to the sample to quantify the local impedance of the interface normal to the surface of the sample. An ac voltage having a frequency is applied to the sample. The sample is placed at a fixed distance from the cantilevered tip and a phase angle of the cantilevered tip is measured. The position of the cantilevered tip is changed relative to the sample and another phase angle is measured. A phase shift of the deflection of the cantilevered tip is determined based on the phase angles. The impedance of the grain boundary, specifically interface capacitance and resistance, is calculated based on the phase shift and the frequency of the ac voltage. Magnetic properties are measured by applying a dc bias to the tip that cancels electrostatic forces, thereby providing direct measurement of magnetic forces.

12 Claims, 13 Drawing Sheets

OTHER PUBLICATIONS

Hari, N.S. et al., "Complex impedance analyses of n–BaTiO3 ceramics showing positive temperature coefficient of resistance", *Journal of Materials Science in Electronics*, 1997, 8, 15–22.

Waser, R. et al., "Grain boundaries in dielectric and mixed–conducting ceramics", *Acta Mat*, 2000, 48, 797–825.

Fleig, J. et al., "Microcontact impedance measurements of individual highly resistive grain boundaries: General aspects and application to acceptor–doped SrTiO3", *Journal of Applied Physics*, 2000, 87(5), 2372–2381.

Kim, S.H. et al., "Influence of defect segregation on the electrical properties on Nb–doped SrTiO3 grain boundary layer", *Jpn. J. Appl. Phys.*, 2000, 39, 1788–1795.

Skapin, A.S. et al., "Grain boundary conductance in AgCl gained by micro–contact impedance spectroscopy", *Solid State Ionics*, 2000, 133, 129–138.

Hwang, J.H. et al., "ingle grain boundary characterization of Nb–doped SrTiO3 bicrystals using ac four–point impedance spectroscopy", *Applied Physics Letters.*, 2000, 76, 2621–2623.

Tanaka, S. et al., "Direct measurements of voltage–current characteristics of single grain boundary of ZnO viristors", *Journal of the European Ceramic Society.*, 1999, 19, 727–730.

Kalinin, S.V. et al., "Surface potential at surface–interface junctions in SrTiO3 bicrystals", *Physical Review* B,62(15), 10 419–10 430 , 2000.

Huey, B.D. et al., "Spatially localized dynamic properties of individual interfaces in semiconducting oxides", *Applied Physics Letters*, 2000, 76(8), 1012–1014.

Williams, C.C. "Two–dimensional dopant profiling by scanning capacitance microscopy", *Annu. Rev. Mat Sci.*, 1999, 29, 471–504.

De Wolf, P. et al., "One– and two–dimensional carrier profiling in semiconductors by nanospreading resistance profiling", J, *Vac. Sci. Technol*, 1996, 14(1), 380–385.

Oyama, Y, et al., "Analysis of scanning probe used for simultaneous measurement of tunneling current and surface potential", *Journal of Applied Physics.*, 1999, 86(12), 7087–7093.

Stranick, S.J. et al., "A versatile microwave–frequency–compatible scanning tunneling microscope", *Rev. Sci. Instrum.*, 1993, 64(5), 1232–1234.

Cho, Y. et al., "Scanning nonlinear dielectric microscope", *Rev. Sci. Instr.*, 1996, 67(6), 2297–2303.

Chaikin, P.M. et al., *Principles of Condensed Matter Physics*, 1997, Cambridge University Press, New York.

Sarid, D., *Scanning Force Microscopy*, 1991, Oxford University Press, New York.

Kim, S.H. et al., "Effect of MnO addition on the electrical properties of Nb–doped SrTiO3 varistor", *Materials in Science & Engineering.*, 1999, 56, 12–20.

Pike, G.E. "Semiconductor grain boundary admittance: Theory", *Phys. Rev*, 1984, 30, 795–802.

Blatter, G, "Electrical breakdown at semiconductor grain boundaries", *Phys. Rev. B.*, 1986, 34(12), 8555–8572.

Babcock, K. et al., "Magnetic force microscopy: Recent advances and applications", *Matter. Res. Soc. Syrup. Proc*, 1995, 355, 311–323.

Zhong, Q. et al., "Fractured polymer/silica fiber surface studied by tapping mode atomic force microscopy", *Surface Science Letters.*, 1993, 290, L688–L692.

Rice, P., et al., "Observation of the effects of tip magnetization states on megnetic force microscopy images", *J. Appl. Phys.*, 1999, 85(8), 5163–5165.

Ferrier, R.P. et al., "Characterisation of MFM tip fileds by electron tomography", *IEEE Transactions on Magnetics.*, 1997, 33(5), 4062–4064.

Hug, H.J. et al., "Quantitative magnetic force microscopy on perpendicularly magnetized samples", *J. Appl. Phys.*, 1998, 83(11), 5609–5620.

Ishii, I. et al., "A novel numerical approach to interpret images obtained by magnetic force microscope", *IEEE Transactions on Magnetics*, 1998, 34(5), 3455–3458.

Saito, H. et al., "Description of magnetic force microscopy by three–dimensional tip Green's function for sample magnetic charges", *Journal of Magnetism & Magnetic Materials*, 1999, 191, 153–161.

Tomilson, S.L. et al., "Micromagnetic model for magnetic force microscopy tips", *J. Appl. Phys.*, 1997, 81(8), 5029–5031.

Al–Khafaji, M.A., "Magnetic force microscopy of nanocrystalline NdFeB ribbons: A study of tip–sample interaction using a well–characterised sample", *Journal of Magnetism & Magnetic Materials*, 1998, 182, 111–123.

Hartmann, U., "The point dipole approximation in magnetic force microscopy", *Physics Letters A.*, 1989, 137(9), 475–478.

Hartmann, U., "Magnetic force microscopy", *Annu. Rev. Mater Sci*, 1999, 29, 53–87.

Kong, L. et al., "Quantification of magnetice force microscopy using a micronscale current ring", *Appl. Phys. Lett*, 1997, 70(15), 2043–2045.

Hartmann, U., "Theory of magnetic force microscopy", *J. Vac. Sci. Technol*, 1990, 8(1),411–415.

Lohau, J. et al., "Quantitative determination of effective dipole and monopole moments of magnetic force microscopy tips", J. Appl. Phys., 1999, 86(6), 3410–3417.

Weaver, J.M.R. et al., "High resolution atomic force microscopy potentiometry", *J. Vac. Sci. Technol.*, 1991, 9, 1559–1561.

Nonnenmacher, M. et al., "Kelvin probe force microscopy", *Appl. Phys. Lett*, 1991, 58(25), 2921–2923.

\* cited by examiner

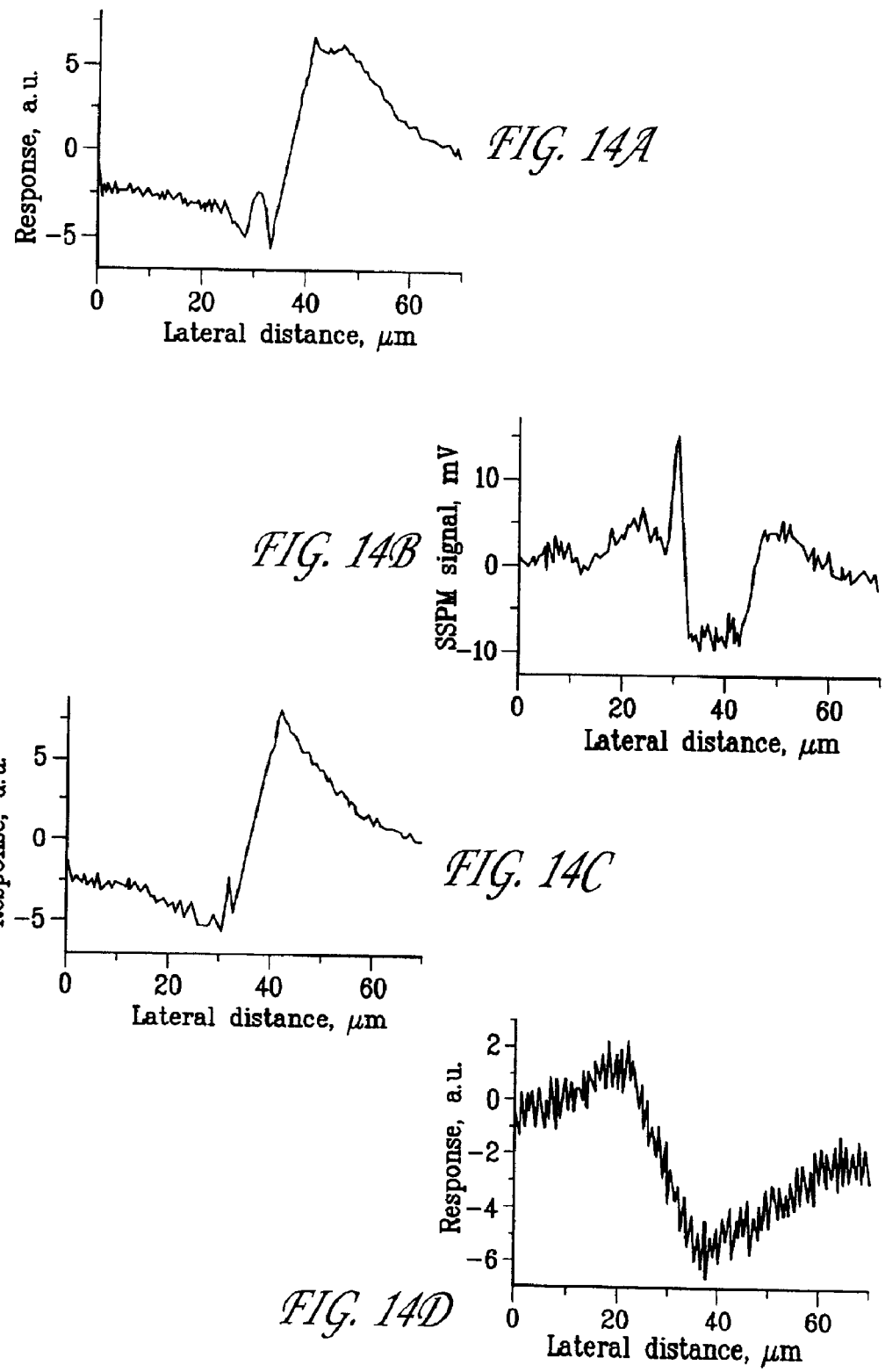

SPATIALLY RESOLVED ELECTROMAGNETIC PROPERTY MEASUREMENT

CROSS-REFERENCE TO RELATED APPLICATIONS

This application claims the benefit of U.S. Provisional Patent Application Ser. No. 60/262,347 entitled "Scanning Impedance Microscopy Of Interfaces," filed Jan. 18, 2001, which is hereby incorporated by reference in its entirety.

STATEMENT REGARDING FEDERALLY SPONSORED RESEARCH OR DEVELOPMENT

The invention was supported in part by funds from the U.S. Government (MRSEC Grant No. NSF DMR 00-79909) and the U.S. Government may therefore have certain rights in the invention.

FIELD OF THE INVENTION

The invention relates generally to electromagnetic property measurement, and more particularly, to spatially resolved impedance microscopy of interfaces and to distinguishing surface potential induced forces from magnetically induced forces for current carrying materials.

BACKGROUND OF THE INVENTION

Many classes of devices function based on the structure, topology, and other properties of grain boundaries or interfaces. Examples include varistors, PTCR thermistors, diodes, chemical sensors, and solar cells. The properties of interfaces have been extensively studied by macroscopic techniques, such as dc transport measurements and impedance spectroscopy, etc. These techniques address averaged properties of interfaces and little or no information is obtained about the properties of an individual interface. Recently, a number of approaches have been suggested to isolate individual grain boundaries using micropatterned contacts or bicrystal samples. A number of works accessing current-voltage (I-V) characteristic of single interfaces also have been reported; however, a major limitation of such techniques is a preset contact pattern, which does not yield spatially resolved information. Moreover, contact resistance and contact capacitance are included in the measurements, which may decrease accuracy and complicate data interpretation. Scanning probe microscopy (SPM) techniques have been successfully used to detect stray fields over Schottky double barriers and to image potential drops at laterally biased grain boundaries; however, the information provided by SPM has been limited to static or dc transport properties of grain boundaries.

SPM techniques based on the detection of tip-surface capacitance and dc resistivity are well known, and some are capable of detecting the frequency dependence of tip-surface impedance. However, such techniques do not quantify the local impedance of an interface normal to the surface, i.e., local characterization of ac transport properties of an interface.

Further, some techniques provide force gradient images of interfaces, such as conventional magnetic-force microscopy (MFM). MFM is a dual pass technique based on detecting the dynamic response of a mechanically driven cantilever a magnetic field. During a first pass, the ferromagnetic tip of the cantilever acquires a surface topology profile of a sample in an intermittent contact mode. Then, during a second pass, the cantilever is driven mechanically and the surface topographic profile is retraced at a predefined tip-to-sample surface separation. The magnetic force $F_{magn}$ between the tip and the sample surface varies along the length of the sample, thereby causing a change in cantilever resonant frequency that is proportional to the force gradient and is given by:

$$\Delta\omega = \frac{\omega_o}{2k}\frac{dFmagn(z)}{dz} \qquad \text{Equation 1}$$

where k is the cantilever spring constant, $\omega_0$ is the resonant frequency of the cantilever, and z is the tip to surface separation distance. Resonant frequency shift, $\Delta\omega$, data is collected and arranged as a MFM image of the sample. Image quantification in terms of surface and tip properties is complex due to the non-local character of the tip-surface interactions. In one point probe approximation, the magnetic state of the tip is described by its effective first and second order multipole moments. The force acting on the probe is given by:

$$F = u_0(q + m\nabla)H \qquad \text{Equation 2}$$

where q and m are effective probe monopole and dipole moments, respectively, H is the stray field above the surface of the sample, and $u_0$ is the magnetic permeability of a vacuum ($1.256 \times 10^{-6}$ H/m). The effective monopole and dipole moments of the tip can be obtained by calibrating against a standard system, for example, micro-fabricated coils or lines carrying a known current. These can be used to quantify the MFM data. However, the total force gradient over the sample may be affected by electrostatic interactions.

Therefore, a system and method that quantifies the local impedance of the interface normal to the sample surface and that overcomes errors introduced by electrostatic interactions would be desirable.

SUMMARY OF THE INVENTION

An aspect of the invention is directed to a scanning probe technique based on detecting phase change and amplitude of a cantilevered tip proximate to a sample surface, where the oscillations of the cantilevered tip are induced by a bias laterally applied to the sample, and the local impedance of the interface normal to the surface of the sample is quantified.

Frequency dependence of local phase angle and oscillation amplitude can be used to determine resistance and capacitance of the interface, given a known current limiting resistor. The frequency dependent interface impedance in the parallel R-C approximation is defined by capacitance, C, and resistance, R, as $Z=1/(1/R+i\omega C)$. Variation of dc bias offset across the interface can be used to determine capacitance—voltage (C-V) and resistance—voltage (R-V) characteristics of the interface, where both capacitance across a grain boundary, $C_{gb}$, and resistance across a grain boundary, $R_{gb}$, can be voltage and frequency dependent.

According to another aspect of the invention, magnetic properties of a sample are determined by applying an ac bias to the tip, wherein the ac signal is set to the resonant frequency of the cantilevered tip. A dc bias is applied to the tip and adjusted to cancel the surface potential of the sample. An ac bias is applied to the sample and magnetic fields are determined. The determined magnetic fields do not substantially include interactions from electrostatic forces.

These features, as well as other features, of the invention will be described in more detail hereinafter.

BRIEF DESCRIPTION OF THE DRAWINGS

The invention is further described in the detailed description that follows, by reference to the noted drawings by way of non-limiting illustrative embodiments of the invention, in which like reference numerals represent similar parts throughout the several views of the drawings, and wherein:

FIG. 14a is a graph of lateral sample distance versus determined force at the nulling tip bias, obtained from the system of FIG. 1;

FIG. 14b is a graph of lateral sample distance versus determined potential, obtained from the system of FIG. 1;

FIG. 14c is a graph of lateral sample distance versus a difference of the force and potential profiles of FIGS. 14a, 14b, obtained from the system of FIG. 1; and FIG. 14d is a graph of lateral sample distance versus force of experimental data measured while adjusting the dc bias of the tip to match surface potential, obtained from the system of FIG. 1.

DETAILED DESCRIPTION OF ILLUSTRATIVE EMBODIMENTS

Figure 1:
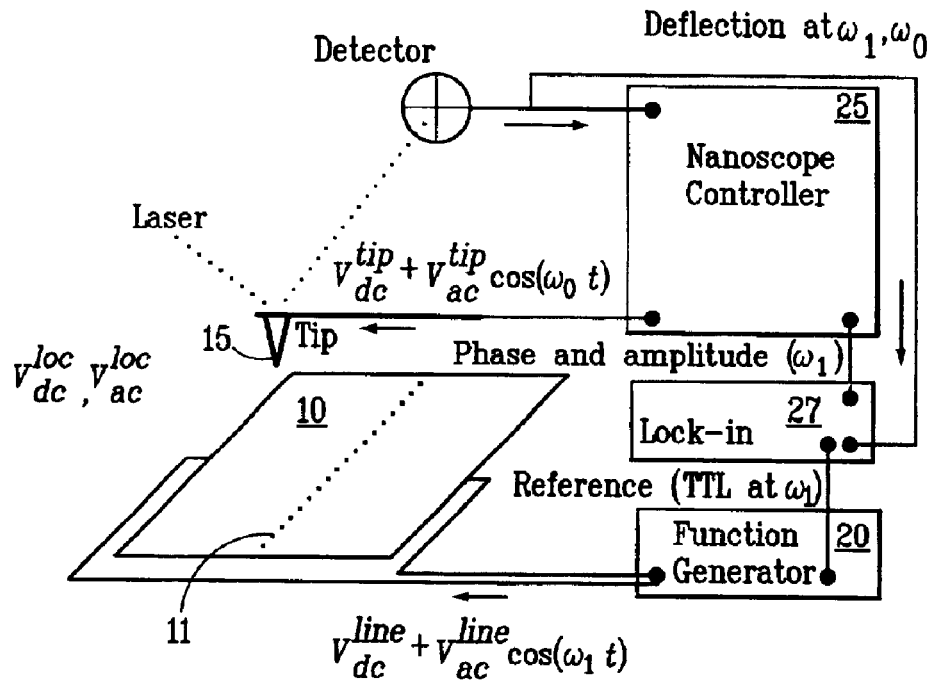
FIG. 1 is a block diagram of a measurement system in accordance with the invention.

FIG. 1 illustrates a block diagram of a measurement system in accordance with an embodiment of the invention. As shown in FIG. 1, the local impedance of a sample 10 is determined across a grain boundary 11. A bias is laterally applied to the sample 10, across the grain boundary 11, and the deflection of a cantilevered tip 15 is measured. Tip 15 may be magnetic or non-magnetic. For determining grain boundary impedance, tip 15 is typically non-magnetic. The sample bias is applied with a function generator 20. The magnitude and phase of the deflection of cantilevered tip 15 are measured with a conventional atomic-force microscope (AFM) controller 25 (Nanoscope-III, Digital Instruments, Santa Barbara, Calif.). Lock in amplifier 27 is coupled to function generator 20 and AFM controller 25. AFM controller 25 may include a processor for processing measurements taken from tip 15; alternatively a separate processor may be coupled to AFM controller 15.

Tip 15 traverses the tip along a predetermined path on the surface of the sample while tip 15 is disposed proximate the surface of the sample. During the traversing, the sample surface topography along the path is determined. An ac voltage is applied to the sample, laterally across the interface. With the ac voltage applied to the sample, tip 15 retraces the path at a predetermined tip-to-sample distance. The response of tip 15 is measured and analyzed to produce information about the impedance of the interface. The measurements include phase and amplitude measurements of the cantilevered tip 15 and can yield an impedance product or can be combined with other known techniques to yield a resistance and a capacitance of the interface, thereby providing spatially resolved impedance information.

The system of FIG. 1 was used to take measurements of a Σ5 grain boundary in a Nb-doped SrTiO$_3$ bicrystal. Tip 15 first traces and path along the sample, across the interface and acquires surface topography in intermittent contact mode and then retraces the surface profile maintaining constant tip-surface separation, i.e., a first pass and a second pass. In the first pass, the tip was static (i.e., neither mechanical nor voltage modulation is applied to the tip). In the second pass, lock-in amplifier 27 (Model SRS830, Stanford Research Systems, Sunnyvale, Calif.) was used to determine the magnitude and phase of the deflection of the cantilevered tip. The magnitude and phase are related to the first harmonic of the force acting on dc biased tip 15. Lock-in amplifier 27 phase offset was set to zero with respect to the function generator 20 output (Model DS340, Stanford Research Systems, Sunnyvale, Calif.). The output amplitude and phase shift, θ, were recorded by the AFM controller 25.

Figure 2:
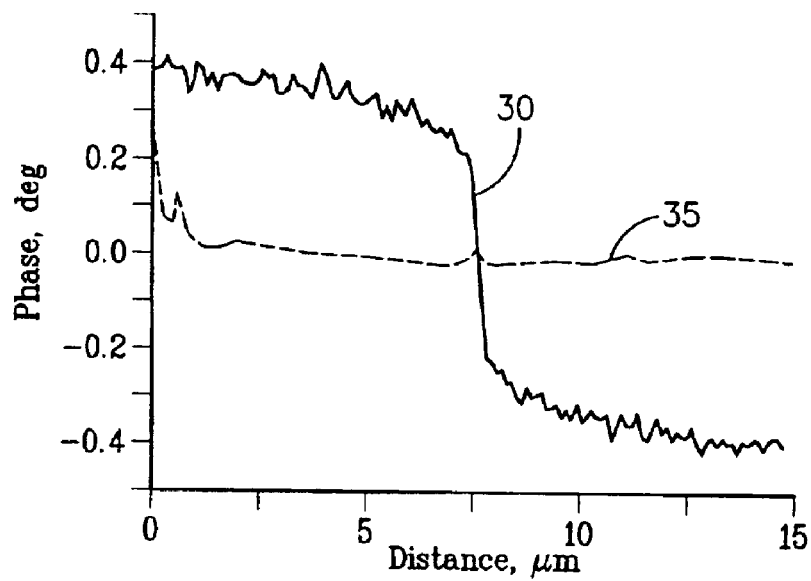
FIG. 2 is a graph showing measured phase and amplitude signals versus distance across a grain boundary region obtained from the system of FIG. 1.

Using this recorded data, amplitude and phase can be graphed versus distance along the sample path. FIG. 2 shows an exemplary graph of deflection amplitude 35 and phase 30 versus distance along the sample path. As can be seen, the phase shift occurs approximately at a distance of 7 um from the beginning of measurements, as the phase values shift from positive values to negative values.

Grain boundary position was detected by potential variation due to stray fields of the Double Schottky Barrier (DSB) in a grounded crystal or the potential drop for a laterally biased crystal by scanning surface potential microscopy (SSPM). To perform measurements under bias, $SrTiO_3$ bicrystals were soldered with indium to copper contact pads and an external ac or dc bias was supplied by function generator 20.

Two-point dc transport properties of the crystal were independently probed by an HP4145B Semiconductor Parameter Analyzer (Hewlett Packard). AC transport properties were measured by an HP4276A LCZ meter (Hewlett Packard) in the frequency range 0.2–20 kHz.

Application of an ac bias having a frequency $\omega$ across the grain boundary results in a phase shift, $\phi_{gb}$, such that:

$$\tan(\varphi_{gb}) = \frac{\omega C_{gb} R_{gb}^2}{(R+R_{gb}) + R\omega^2 C_{gb}^2 R_{gb}^2} \qquad \text{Equation 3}$$

where $C_{gb}$ and $R_{gb}$ are grain boundary capacitance, grain boundary resistance, respectively. R is the resistance of a current limiting resistor (circuit termination resistance) in the circuit biasing the sample.

In the high frequency limit (defined herein as the region in which $\tan(\phi_{gb}) \sim \omega^{-1}$):

$$\tan(\varphi_{gb}) = \frac{1}{\omega R C_{gb}} \qquad \text{Equation 4}$$

In the low frequency limit (defined herein as the region in which $\tan(\phi_{gb}) \sim \omega$):

$$\tan(\varphi_{gb}) = \frac{\omega C_{gb} R_{gb}^2}{(R+R_{gb})} \qquad \text{Equation 5}$$

Therefore, analysis in the high frequency limit yields $C_{gb}$ and analysis in the low frequency limit yields $R_{gb}$ and $C_{gb}$. Crossover between the two limits occurs at a frequency of $\omega_r$, which is given by:

$$\omega_r^2 = \frac{R+R_{gb}}{R C_{gb}^2 R_{gb}^2} \qquad \text{Equation 6}$$

at which $\tan(\phi_{gb})$ has its maximum value of:

$$\tan(\varphi_{gb}) = \frac{R_{gb}}{2\sqrt{R(R+R_{gb})}} \qquad \text{Equation 7}$$

It should be noted that for high R termination, the crossover occurs at $\omega=1/R_{gb}C_{gb}$, i.e., intrinsic relaxation frequency of the interface, while for low R termination, the resonance frequency shifts to higher values. However, introduction of high R in the circuit decreases the amplitude of measured signal; therefore, the best results can be obtained when R is close to $R_{gb}$. Alternatively, the value of R can be varied within several orders of magnitude to obtain quantitative data. In this fashion, the presence of stray resistive (and capacitive) elements can also be detected.

The bias to the sample simultaneously induces an oscillation in surface potential, $V_{surf}$, according to:

$$V_{surf} = V_s + V_{ac}\cos(\omega t + \phi_c), \qquad \text{Equation 8}$$

where $\phi_c$ is the phase shift in the circuit and $V_s$ is dc surface bias. The bias results in a periodic force acting on the dc biased tip. The amplitude, $A(\omega)$, and phase, $\phi$, of the cantilever response to the periodic force $F(t)=F_{1\omega}\cos(\omega t)$ are:

$$A(\omega) = \frac{F_{1\omega}}{m}\frac{1}{\sqrt{(\omega^2-\omega_0^2)^2 + \omega^2\gamma^2}} \qquad \text{Equation 9a}$$

and $$\tan(\varphi) = \frac{\omega\gamma}{\omega^2-\omega_0^2} \qquad \text{Equation 9b}$$

where m is the effective mass, $\gamma$ is the damping coefficient and $\omega_0$ is the resonant frequency, of the cantilever. The first harmonic of the force is:

$$F_{1\omega}(z) = \frac{\partial C(z)}{\partial z}(V_{tip}-V_s)V_{ac} \qquad \text{Equation 10}$$

where z is the tip-surface separation, and C(z) is the tip-surface capacitance.

The local phase shift between the function generator 20 output and the cantilever oscillation is thus $\phi_c+\phi$ on the left of the grain boundary and $\phi_c+\phi_{gb}+\phi$ on the right of grain boundary. Hence, the change in the phase shift of cantilever oscillations across the grain boundary measured by SPM is equal to the true grain boundary frequency shift $\phi_{gb}$. The spatially resolved phase shift signal thus constitutes the electrostatic phase angle image of the biased device. Equations 3 through 10 suggest that phase shift is independent of imaging conditions (tip bias, tip surface separation, driving bias), and therefore, provides reliable data on the local surface properties.

To establish the validity of this technique, phase and amplitude images were acquired under varying imaging conditions. To quantify the experimental data, the average amplitude and phase of the tip response were defined as the averages of unprocessed amplitude and phase images. To analyze the phase shift, the grain boundary phase profiles were averaged over 16 lines, extracted and fitted by a Boltzman function $\phi=\phi_0+\Delta\phi_{gb}(1+\exp((x-x_0)/w))^{-1}$, where w is the width and $x_0$ is the center of phase profile.

Figure 3A:
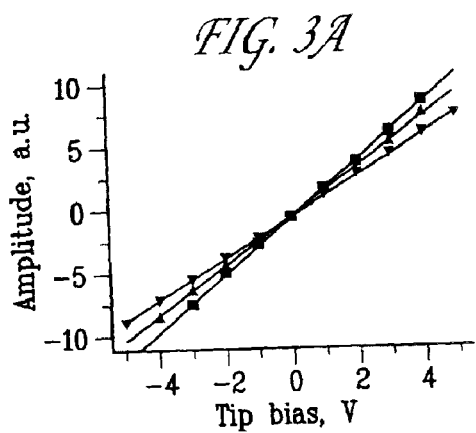
FIGS. 3a and 3b are graphs showing measured cantilever oscillation amplitude versus tip bias and driving voltage, respectively, obtained from the system of FIG. 1.
Figure 3B:
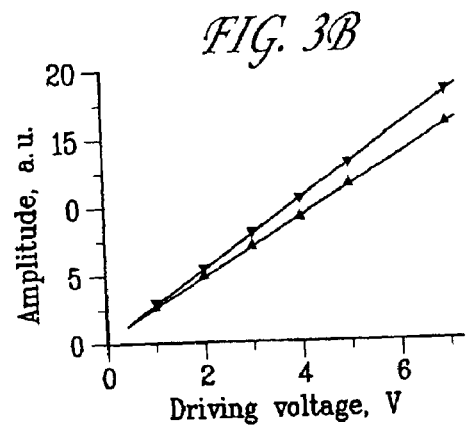
Figure 3C:
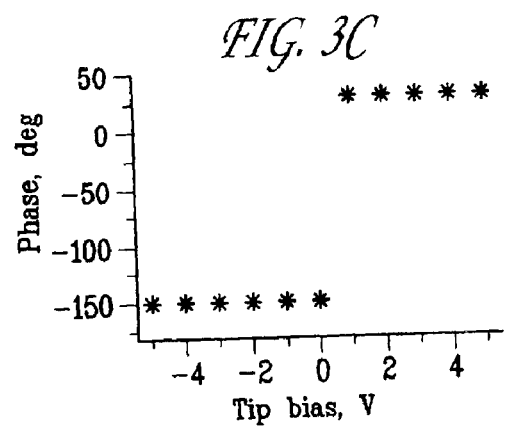
FIGS. 3c and 3d are graphs showing average measured phase versus tip bias and driving voltage, respectively, obtained from the system of FIG. 1.
Figure 3D:
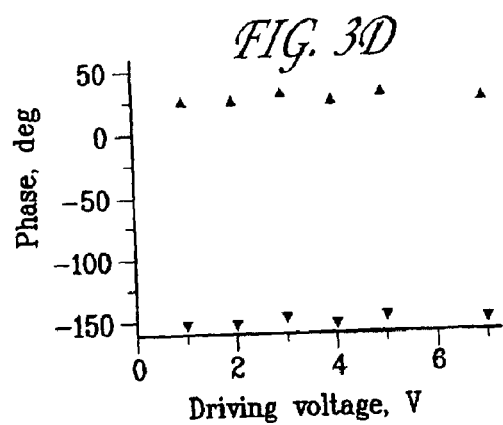
Figure 3E:
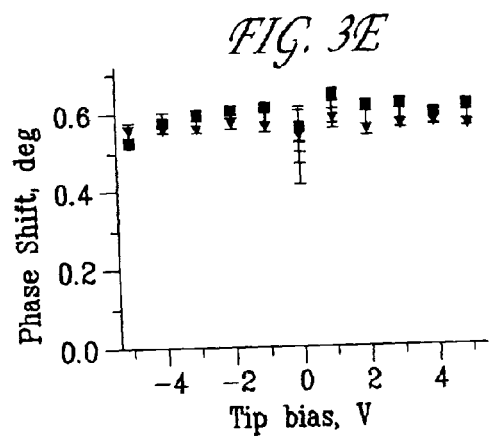
FIGS. 3e and 3f are graphs showing grain boundary phase shift versus tip bias and driving voltage, respectively, obtained from the system of FIG. 1.
Figure 3F:
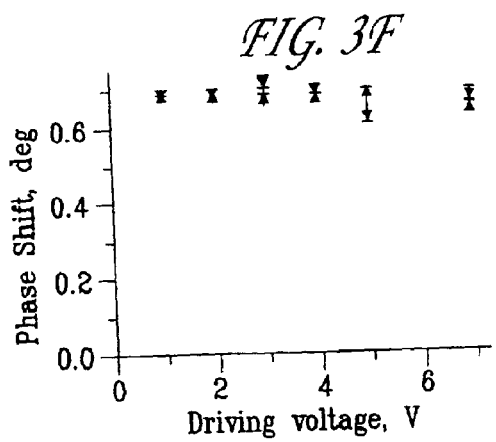

The driving frequency dependence of the average phase shift and amplitude are found to be in agreement with Equations 7a and 7b. The amplitude was found to be linear in tip bias, as shown in FIG. 3a, in an excellent agreement with Equation 10. The amplitude is nullified when the tip bias is $V_{dc}=0.28\pm0.02$ V independent of tip-surface separation. Equation 10 implies that this condition is achieved when $V_{dc}=V_s$, thus yielding the value of surface potential. The phase of the response changes by 180° between $V_{dc}=0$ and $V_{dc}=1$ indicative of transition from a repulsive to an attractive interaction, as shown in FIG. 3c. The grain boundary phase shift is found to be independent of tip bias, as shown in FIG. 3e. A small variation in the grain boundary phase shift occurs when tip potential, $V_{dc}$, is close to the surface potential, $V_s$, and the amplitude of cantilever response is small. This results in a large error in the phase signal and associated higher noise level of the phase image. Note that the slopes of lines in FIG. 3a are smaller for large tip-surface separations, indicative of a decrease in capacitive force. At the same time, the grain boundary phase shift does not depend on distance. The amplitude is linear in driving bias, $V_{ac}$, as shown in FIG. 3b. Both the average and grain boundary phase shift are essentially driving amplitude independent, as shown in FIGS. 3d and 3e.

To summarize, experimental observations indicate that the amplitude of the cantilever response is linear in tip bias and driving voltage and is a complex function of tip-surface separation and driving frequency, in agreement with Equations 9b and 10. At the same time, grain boundary phase shift is independent of tip surface separation, tip bias, and driving voltage provided that the response is sufficiently strong to be above the noise level. Hence, it can be attributed to the phase shift of ac bias through the grain boundary. Further, tip bias, frequency and driving amplitude dependence of cantilever response to sample ac bias were found to be in excellent agreement with the theoretical model.

Figure 4A:
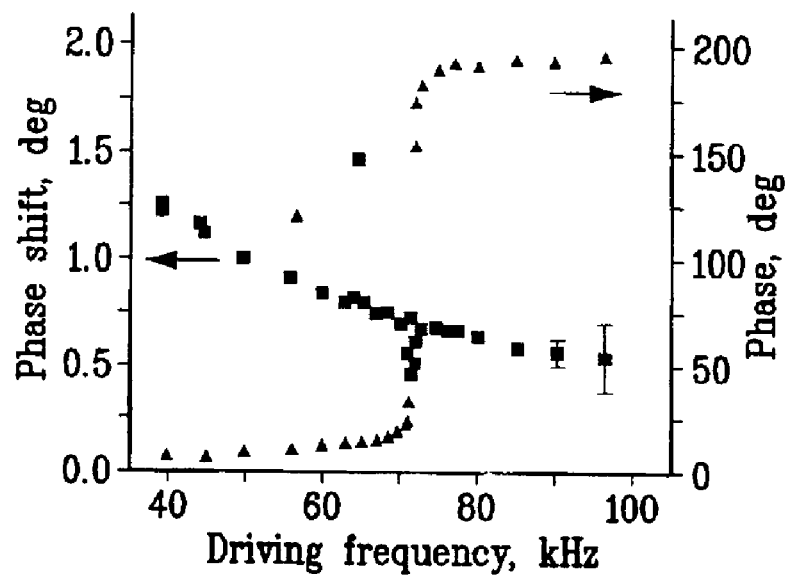
FIGS. 4a and 4b are graphs showing average phase shift and grain boundary phase shift, respectively, versus driving frequency, obtained from the system of FIG. 1.
Figure 4B:
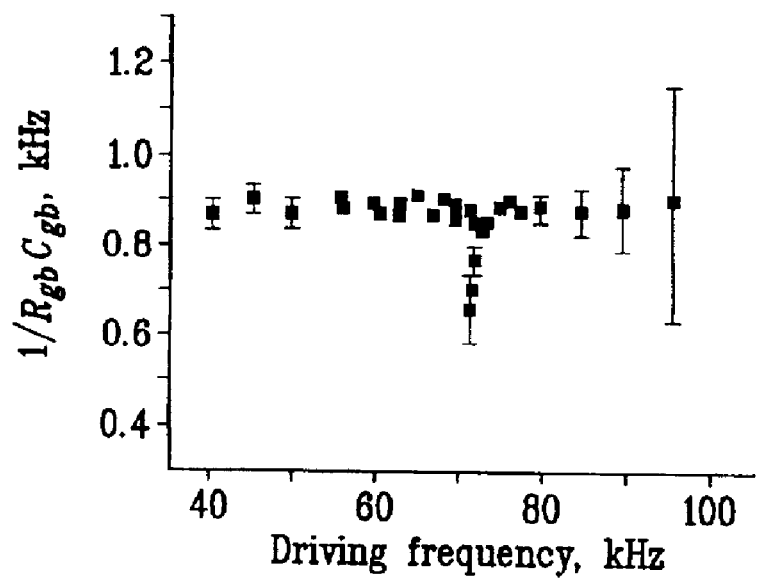

The frequency dependencies of average and grain boundary phase shift are shown in FIGS. 4a and 4b. The average phase shift changes from 0 for $\omega \ll \omega_r$ to 180° for $\omega \gg \omega_r$ is in agreement with Equation 9b, while the grain boundary phase shift decreases with driving frequency. As predicted by Equation 3, the product $\omega \tan(\phi_{gb})$ is frequency independent and is equal to $RC_{gb}$. Calculated values of $\omega \tan(\phi_{gb})$ as a function of $\omega$ are shown in FIG. 4b. The product is substantially constant and from the experimental data, $R_{gb}C_{gb} \approx 1.1 \cdot 10^{-3}$ s. Analysis in the vicinity of the resonant frequency of the cantilever is complex due to the cross talk between ac driving and cantilever oscillations during topography acquisition and the resonant frequency shift of the cantilever due to electrostatic force gradients. For frequencies above $\omega_r$, the amplitude of the response decreases rapidly with frequency, as indicated by Equation 9a, therefore, the phase error increases. Imaging is possible for frequencies as small as $\omega_r/2$. According to Equations 9a and 9b, response at this frequency is essentially equal to the response at zero frequency (dc limit for weak damping). This implies that the frequency range is limited by the acquisition time of lock-in amplifier 27 and scan rate rather than cantilever sensitivity. Consequently, there is no fundamental limitation on imaging at the low frequencies; moreover, spectroscopic variants of this technique can in principle be performed in all frequency ranges below the cantilever resonant frequency $\omega_r$. This yields the local phase angle shift at the grain boundary and determines the product of grain boundary resistivity and capacitance.

Figure 5A:
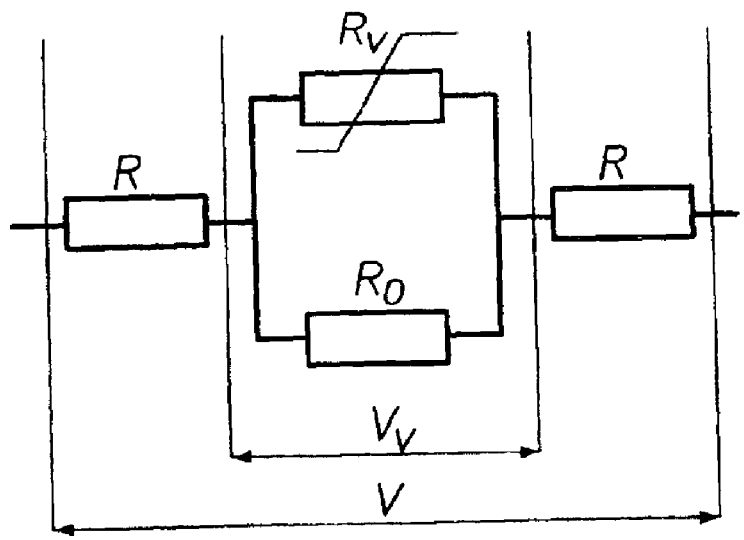
FIG. 5a is a circuit diagram of an equivalent circuit for surface scanning potential microscopy (SSPM) analysis, which can be used in embodiments of the invention to obtain resistance and capacitance values of an interface.
Figure 5B:
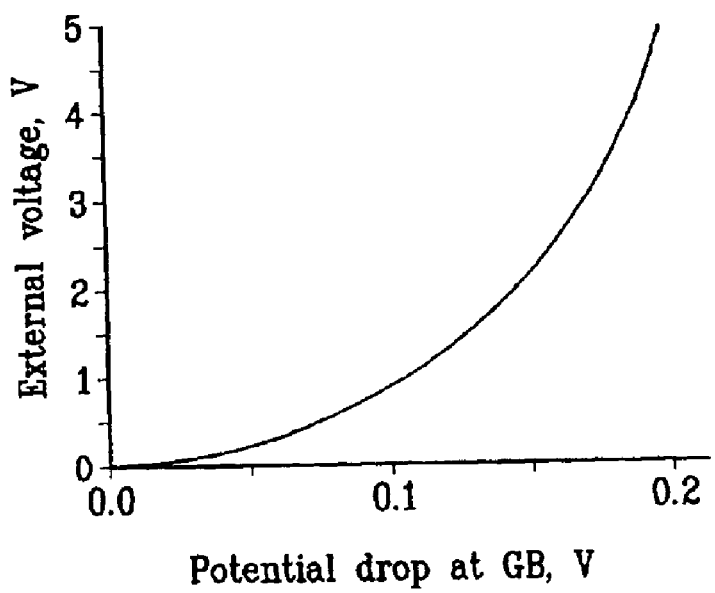
FIG. 5b is a graph showing grain boundary potential drop as a function of bias, obtained from the system of FIG. 1.

To determine the individual values for grain boundary resistivity and capacitance, several techniques may be employed including SSPM, Electrostatic Force Microscopy (EFM), Scanning Tunneling Potentiometry (STP), and the like. SSPM was used to determine grain boundary resistivity for the bicyrstal described above; however, other techniques may be used to determine resistivity. An equivalent circuit for a dc biased grain boundary is shown in FIG. 5a. The resistors, R, correspond to the known current limiting resistors in the experimental setup, while $R_0$ and $R_v$ correspond to the ohmic (e.g., due to the imperfections and/or surface conductivity) and non-ohmic (varistor) components of grain boundary conductivity, respectively. The conductivity of the grain boundary region is:

$$\sigma = \sigma_0 + \gamma V_v^\alpha, \qquad \text{Equation 11}$$

where $\sigma$ is the conductivity of the bicrystal, $\sigma_0 = 1/R_0$, $\alpha$ is the varistor nonlinearity coefficient and $\gamma$ is the corresponding prefactor. The potential drop at the grain boundary, $V_v$, is related to the total dc bias, $V$, applied to the circuit as:

$$V = (1 + 2R\sigma_0)V_v + 2R\gamma V_v^\alpha \qquad \text{Equation 12}$$

Sample bias dependence of grain boundary potential drop is compared to Equation 12. The ohmic contribution to the grain boundary conductivity is $\sigma_0 = (3.8 \pm 0.6) \cdot 10^{-3}$ Ohm$^{-1}$. The nonlinearity coefficient $\alpha \approx 3.5$ is relatively low and within the expected range for SrTiO$_3$ based varistors. In comparison, two-probe I-V measurements between copper contact pads yield $\alpha = 2.7 \pm 0.01$ and $\sigma_0 = (1.59 \pm 0.01) \cdot 10^{-3}$ Ohm$^{-1}$.

Having calculated the ohmic contribution to grain boundary conductivity, the capacitive contribution can be calculated as $1.3 \times 10^{-1}$ F/m$^2$. Using the value of interface resistance from the I-V measurements yields a more accurate estimate of grain boundary capacitance as $5.5 \times 10^{-2}$ F/m$^2$. The values are in agreement with results determined from two probe transport measurements taken at 20 kHz ($C_{gb} = 5.4 \times 10^{-2}$ F/m$^2$) and four pole transport measurements ($C_{gb} = 5.9 \times 10^{-2}$ F/m$^2$).

Figure 7A:
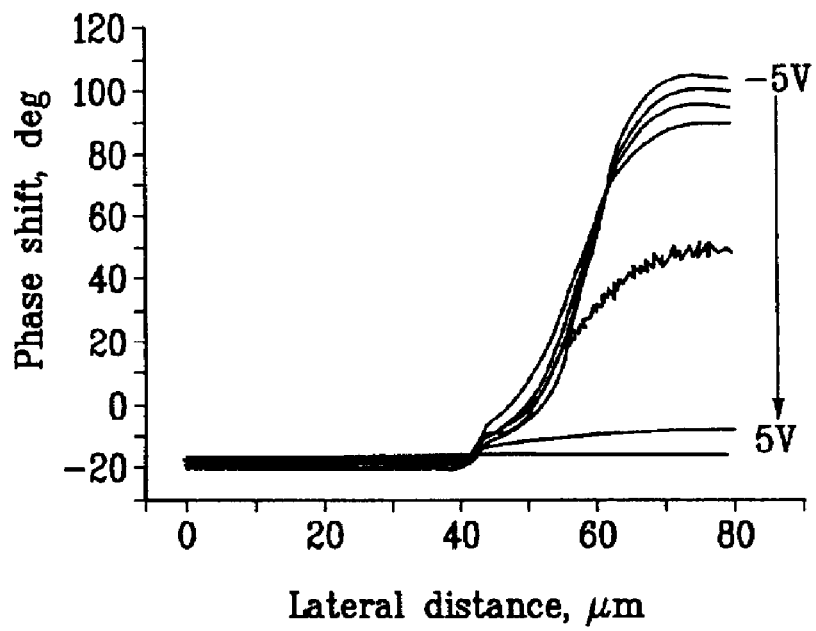
FIGS. 7a and 7b are graphs showing phase shift versus distance along the sample path for various values of R (current limiting resistor), obtained from the system of FIG. 1.
Figure 7B:
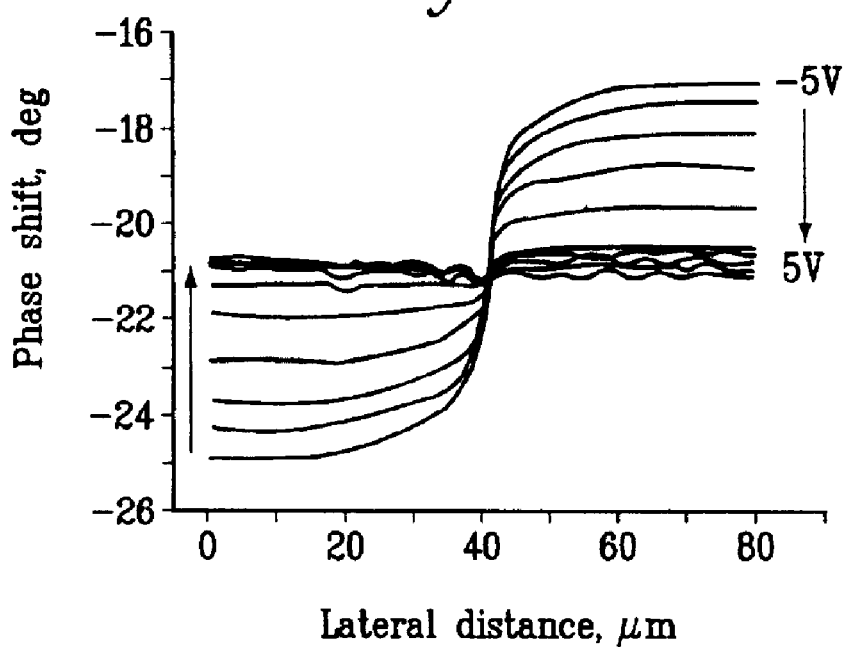

Experimental data was also acquired for a metal-semiconductor interface. SIM phase profiles across the metal-semiconductor interface as a function of bias for different circuit terminations are shown in FIGS. 7a and 7b. FIGS. 7a and 7b were produced using the techniques described above and show a phase profile across the interface for different lateral biases for R=500 Ohm for FIGS. 7a and 100 kOhm for FIG. 7b.

For a small current limiting resistor, the phase shift across the interface is anomalously large, ~172° at 3 kHz and 106° at 100 kHz. Phase shifts $\phi_d > 90°$ imply that application of negative bias to the device results in the increase of surface potential. This behavior is similar to dc potential behavior observed in SSPM measurements and is attributed to photoelectric carrier generation in the junction region. Again, this effect is completely suppressed by current limiting resistors R=10 kOhm and larger and phase shift at the interface for 100 kOhm termination is shown in FIG. 7b. Note that for a forward biased device, phase shift on the left is voltage independent, while there is some residual phase shift on the right of the Schottky barrier. This phase shift is attributable to the diffusion capacitance of a forward biased junction.

Figure 8A:
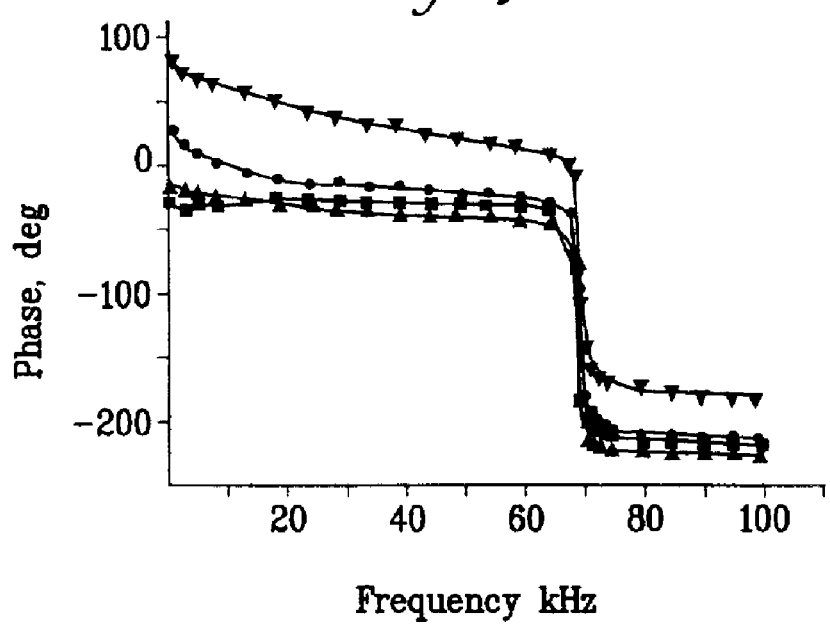
FIGS. 8a and 8b are graphs showing phase and amplitude, respectively versus frequency, obtained from the system of FIG. 1.
Figure 8B:
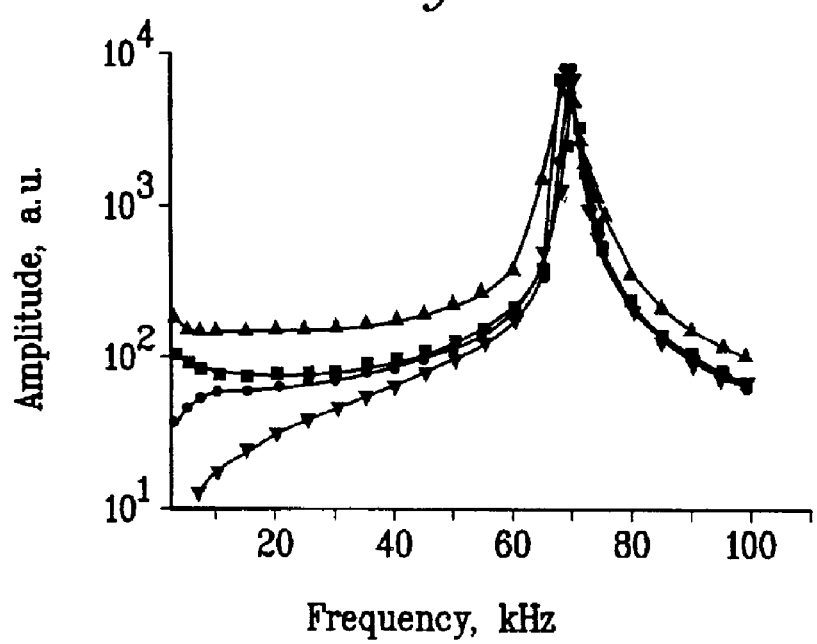

Frequency dependence of tip oscillation phase and amplitude on the left and on the right of the junction is shown in FIGS. 8a and 8b. FIGS. 8a and 8b show frequency dependence of tip oscillation phase (FIG. 8a) and amplitude (FIG. 8b) on the left and on the right of the junction for R=10 kOhm (▼, ▲) and 100 kOhm (■,●). It can be seen that the resulting tip dynamics is rather complex and is determined by the convolution of the harmonic response of tip oscillations to periodic bias and frequency dependence of voltage oscillation phase and amplitude induced by local bias. Nevertheless, the abrupt phase change of about 180° and tip oscillation amplitude maximum at f=72 kHz are indicative of mechanical tip resonance. Detailed analysis of frequency-dependence of the amplitude has demonstrated that resonant frequency on the left and right of the junction are shifted by ~1 khz due to the difference in surface potential and electrostatic force gradient. As suggested by Equations 9a and 9b, phase and amplitude characteristics of a harmonic oscillator are very steep close to the resonant frequency of the oscillator. Therefore, minute changes of the resonance frequency results in major errors for phase and amplitude data in this frequency region. To minimize this effect, the data used for quantitative analysis of frequency dependence of phase and amplitude signal was collected from 3 kHz to 65 kHz and 75 kHz to 100 kHz.

Figure 9A:
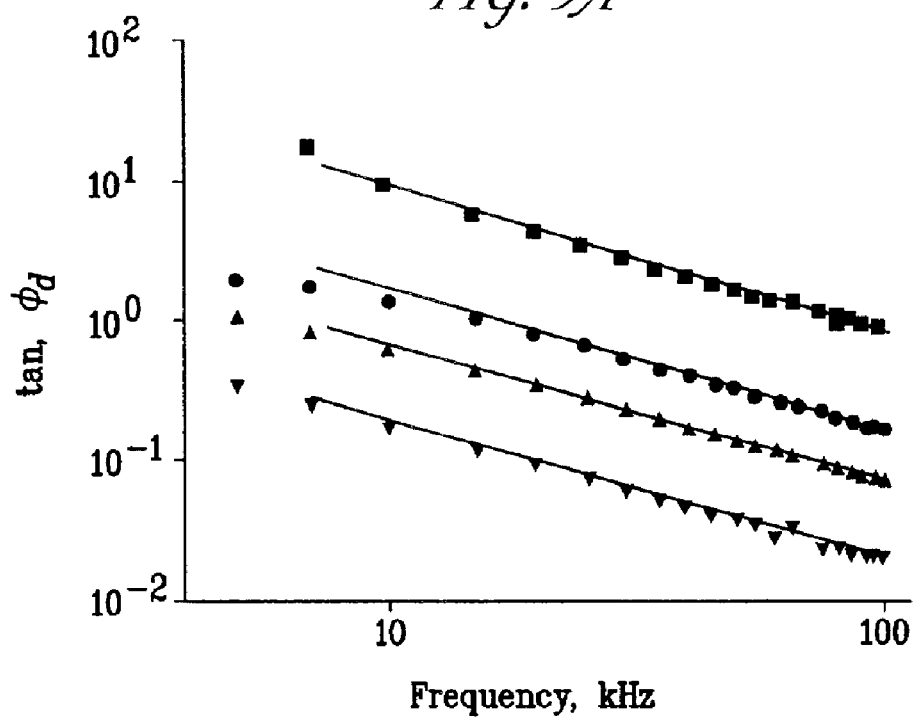
FIGS. 9a and 9b are graphs showing tan (phase shift) and amplitude ratio, respectively versus frequency, obtained from the system of FIG. 1.
Figure 9B:
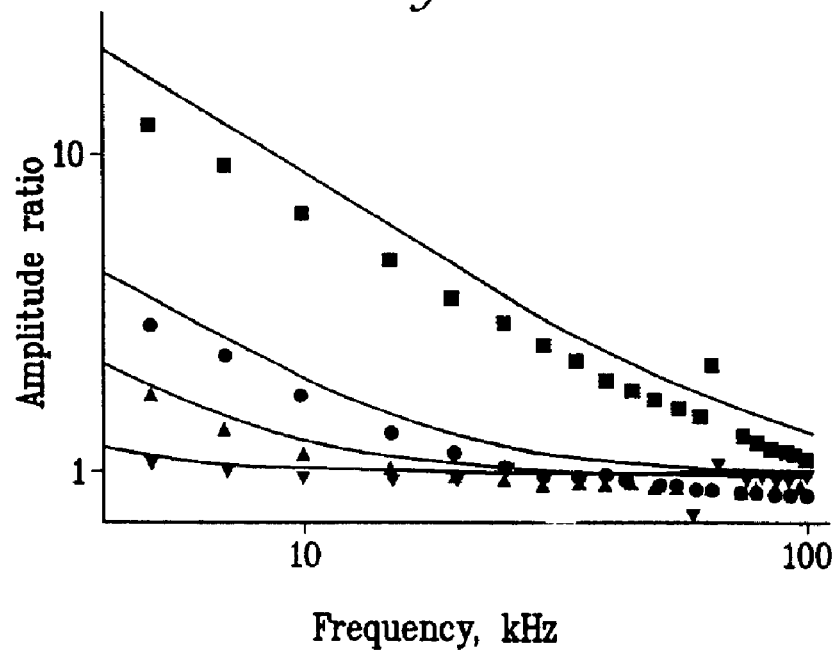

Frequency dependence of phase shift for different circuit current limiting resistors is shown in FIG. 9a. FIGS. 9a and 9b show frequency dependence of $\tan(\phi_d)$ and amplitude ratios, respectively, for circuit terminations of 10 kOhm (■), 47 kOhm (●), 100 kOhm (▼) and 220 kOhm (▲). In FIG. 9a, solid lines are linear fits and fitting parameters are summarized in Table I. In FIG. 9b, solid lines are calculated amplitude ratios. From impedance spectroscopy data the relaxation frequency of the junction is estimated as 1.5 kHz at −5V reverse bias. Therefore, measurements are performed in the high frequency region in which Equation 4 is valid. In agreement with Equation 4, $\tan(\phi_d)$ is inversely proportional to frequency with a proportionality coefficient determined by the product of interface capacitance and resistance of the current limiting resistor (subscripts of d correspond to the interface of the metal semiconductor device). In the vicinity of the resonant frequency of the cantilever ($f_0$=72 kHz ), difference in the force gradient acting on the probe on the left and right of the Schottky barrier results in the shift of cantilever resonant frequency and erratic phase shifts and this region was excluded from data analysis. The experimental data were approximated by function $\log(\tan(\phi_d))$= a+b log(f) and corresponding fitting parameters are listed in Table I.

TABLE I

Frequency dependence of phase shift

| R, kOhm | a | b | $C_d$, $10^{-10}$ F | $V_d$, V |
|---|---|---|---|---|
| 10 | 4.94 ± 0.02 | −0.99 ± 0.01 | 1.83 | 4.83 |
| 47 | 4.21 ± 0.01 | −0.98 ± 0.01 | 2.11 | 3.85 |
| 100 | 3.84 ± 0.01 | −0.98 ± 0.01 | 2.32 | 2.86 |
| 220 | 3.29 ± 0.04 | −0.98 ± 0.02 | 3.76 | 0.80 |

Note that coefficient b is within experimental error from theoretical value b=−1, in agreement with selected parallel R-C model for the interface. As follows from Equation 4, interface capacitance can be determined as $C_d=10^{-a}/(2\pi R)$ and capacitance values for different circuit terminations are listed in Table I. Note that interface capacitance increases with the value of current limiting resistor and in all cases is larger than capacitance obtained from impedance spectroscopy, $C_d=1.71 \cdot 10^{-10}$ F. Amplitude ratio was calculated and compared with experimental results with voltage correction illustrated in FIG. 9(b). Note the agreement between experimental and calculated values despite the absence of free parameters. In general, one would expect worse agreement between theory and experiment for tip oscillation amplitude data due to the high sensitivity of electrostatic forces, and, therefore, oscillation amplitude, to the variations of tip-surface capacitance due to surface roughness.

Figure 6:
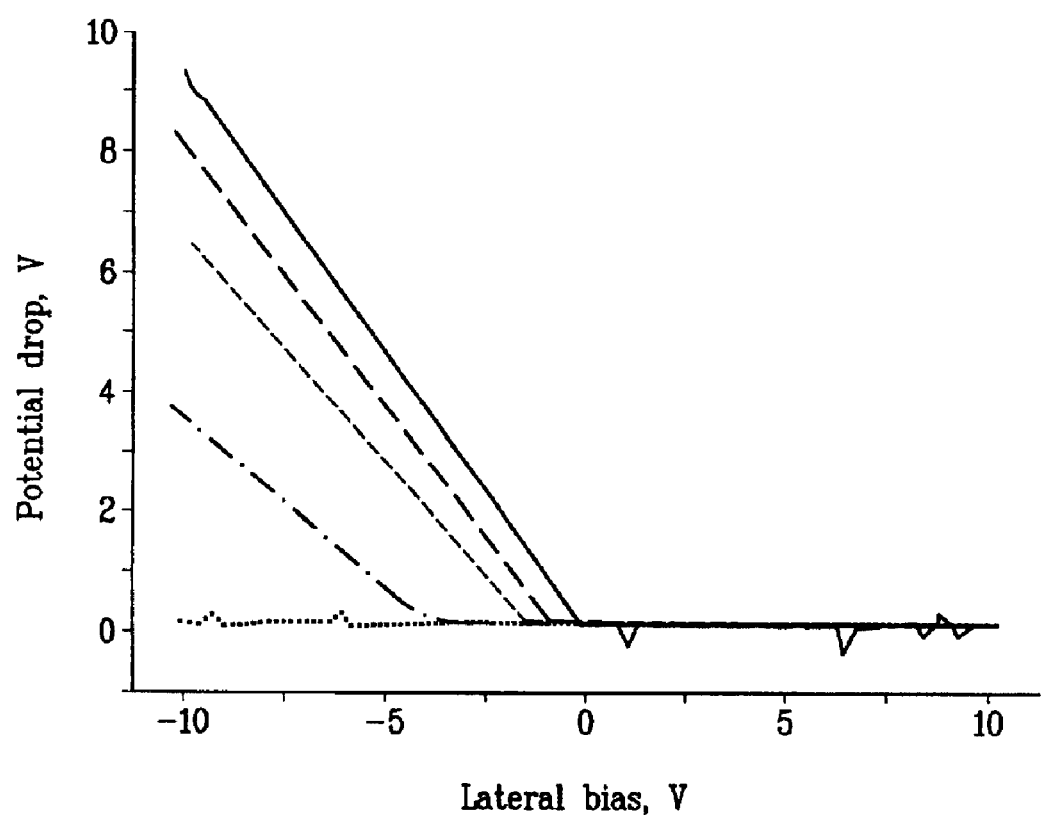
FIG. 6 is a graph showing potential drop at the interface versus lateral bias (i.e., sample bias) for various values of R (current limiting resistor), obtained from the system of FIG. 1.
Figure 10A:
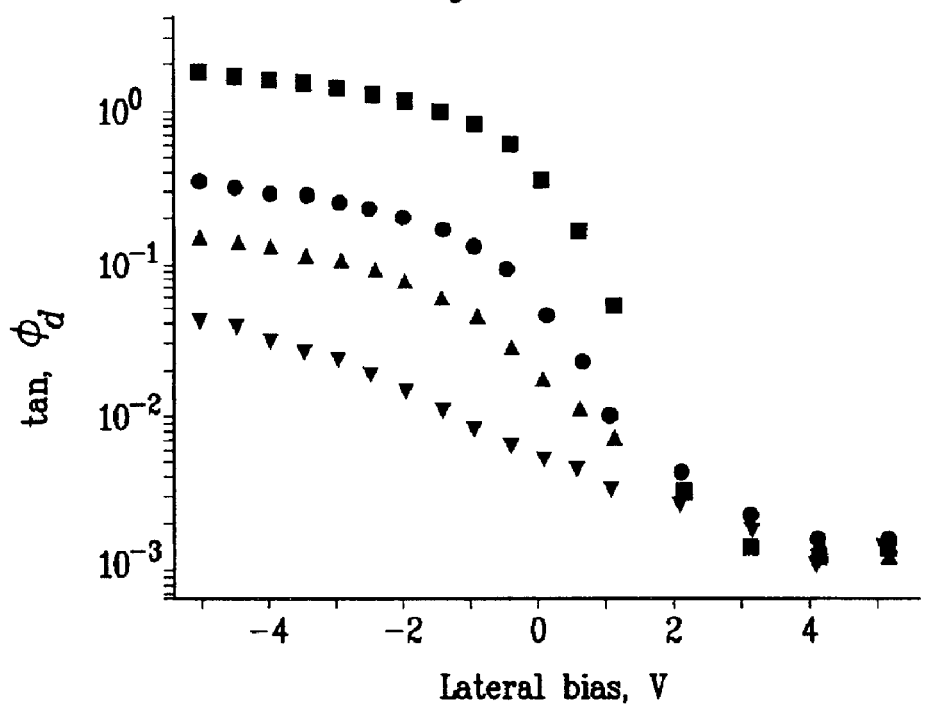
FIG. 10a is a graph showing tan (phase shift) versus lateral bias, obtained from the system of FIG. 1.
Figure 10B:
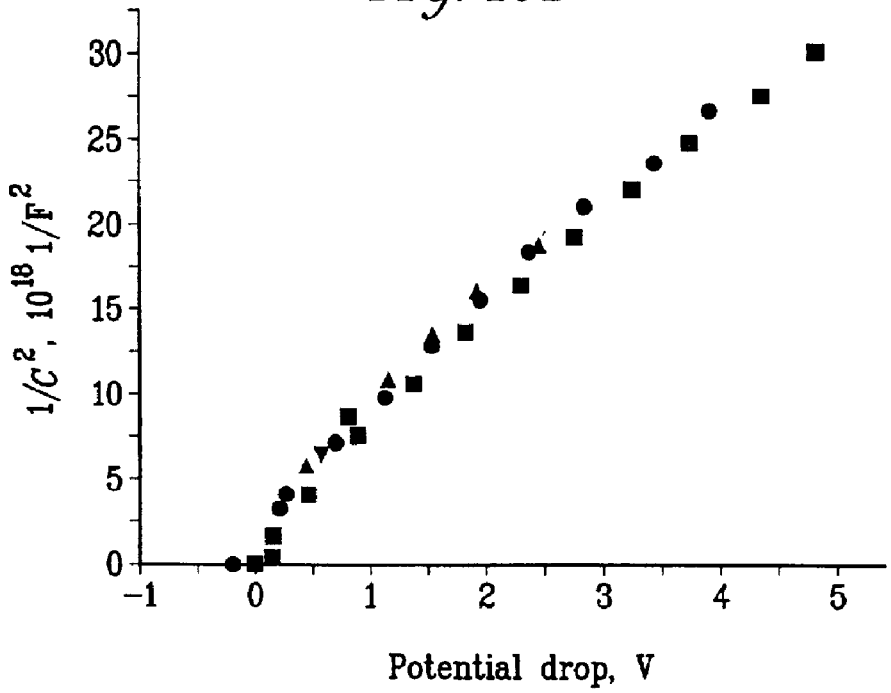
FIG. 10b is a graph showing 1/capacitance$^2$ versus potential drop, obtained from the system of FIG. 1.

The increase of capacitance for large R is due to the well-known dependence of junction capacitance on the bias. As can be seen in FIG. 6, potential drop at the interface at given lateral bias is smaller for large R. FIG. 6 is a graph showing potential drop at the interface as a function of lateral bias for current limiting resistors of 10 kOhm (solid line), 47 kOhm (long dashed line), 100 kOhm (short dashed line), 220 kOhm (alternating dash-dot line), and 1 MOhm (dash-dot-dot line). The slopes and intercepts of the lines in the reverse bias regime are summarized in Table. I. A small potential drop corresponds to small depletion width and high junction capacitance. To verify this assumption, the phase shift at the interface was measured as a function of lateral dc bias for different circuit terminations and the corresponding dependence is shown in FIG. 10a. FIG. 10a shows voltage phase angle tangent $\tan(\phi_d)$ as a function of lateral bias for current limiting resistors of 10 kOhm (■), 47 kOhm (●), 100 kOhm (▼) and 220 kOhm (▲). FIG. 10b shows $1/C^2$ vs. $V_d$ for different current limiting resistors. Note that although $\tan(\phi_d)$ varies by 2 orders of magnitude from R=10 kOhm to R=220kOhm, $1/C^2$ exhibits universal behavior. Also note that under reverse bias (V=−5 V) conditions $\tan(\phi_d)$ changes by almost two orders of magnitude from $\tan(\phi_d)$=1.8 for R=10 kOhm to $\tan(\phi_d)$=0.042 for R=220 kOhm. Interface capacitance vs. lateral bias dependence can be calculated from the data in FIG. 10a. At the same time, potential drop at the interface vs. lateral bias is directly accessible from the SSPM measurements. Combination of the two techniques allows one to determine the C-V characteristic of the interface. Calculated $1/C^2$ vs. $V_d$ dependence is shown in FIG. 10b. Note that the resulting curve shows universal behavior independent of the value of the current limiting resistor. This dependence is approximated by:

$$1/C^2 = (4.0 \pm 0.6) \cdot 10^{18} + (6.1 \pm 0.3) \cdot 10^{18} V_d \quad \text{Equation 13}$$

For an ideal metal-semiconductor junction, voltage dependence of capacitance is given by:

$$\frac{1}{C^2} = \frac{2}{q\varepsilon_s N_B}\left(\phi_B - V - \frac{2kT}{q}\right) \quad \text{Equation 14}$$

where $\varepsilon_s$=11.9, $\varepsilon_0$ is dielectric permittivity for silicon, and $N_B$ is dopant concentration. Comparison of experimental data and Equations 13 and 14 allows estimation of Schottky barrier height as $\phi_B$=0.6±0.1 V, which is in agreement with the Schottky barrier height obtained from I-V measurements ($\phi_B$=0.55 V). From the slope of the line the dopant concentration for the material is estimated as $N_B=1.06 \cdot 10^{24}$ m$^{-3}$.

Therefore, local interface imaging of the metal-semiconductor interface allows junction properties to be obtained that are consistent with properties determined by macroscopic techniques.

In addition to determining grain boundary resistance and capacitance values for a sample having an interface, magnetic force data can be determined for a current carrying sample. Particularly, magnetic force data that is not magnetic gradient force data can be determined. Further, errors from surface potential electrostatic interactions may be reduced by canceling the sample surface potential. This technique is referred to herein as potential correction magnetic-force microscopy (PMFM) and utilizes a magnetic tip 15. Tip 15 may be coated with a magnetic coating or may be constructed entirely or partially of magnetic material. The first harmonic of the force acting on the dc-biased tip, while an ac bias is applied to the sample, can be described as:

$$F_{1\omega}(z) = \frac{\partial C(z)}{\partial z}(V_{dc}^{tip} - V_{surf})V_{ac}^{loc}\sin(\omega t) + qB_{ac}\sin(\omega t) \quad \text{Equation 15}$$

The first term in Equation 15 originates from capacitive tip to surface interactions and is linear with respect to dc tip bias, $V^{tip}{}_{dc}$. The second term originates from magnetic forces and it is assumed that the magnetic interaction is limited only to the first order magnetic monopole, q. The magnetic field amplitude $B_{ac}$ is proportional to the current $I_{ac}$ in the circuit and can be calculated from the Biot-Savart law. The current is proportional to the driving voltage $V_{ac}$, applied to the line. The relationship between the force, magnitude, and phase of the response of a damped harmonic oscillator with resonant frequency $\omega_0$ to the periodic force $F(t)=F_{1\omega}\cos(\omega t)$ are given by Equations 9a and 9b above.

Figure 11:
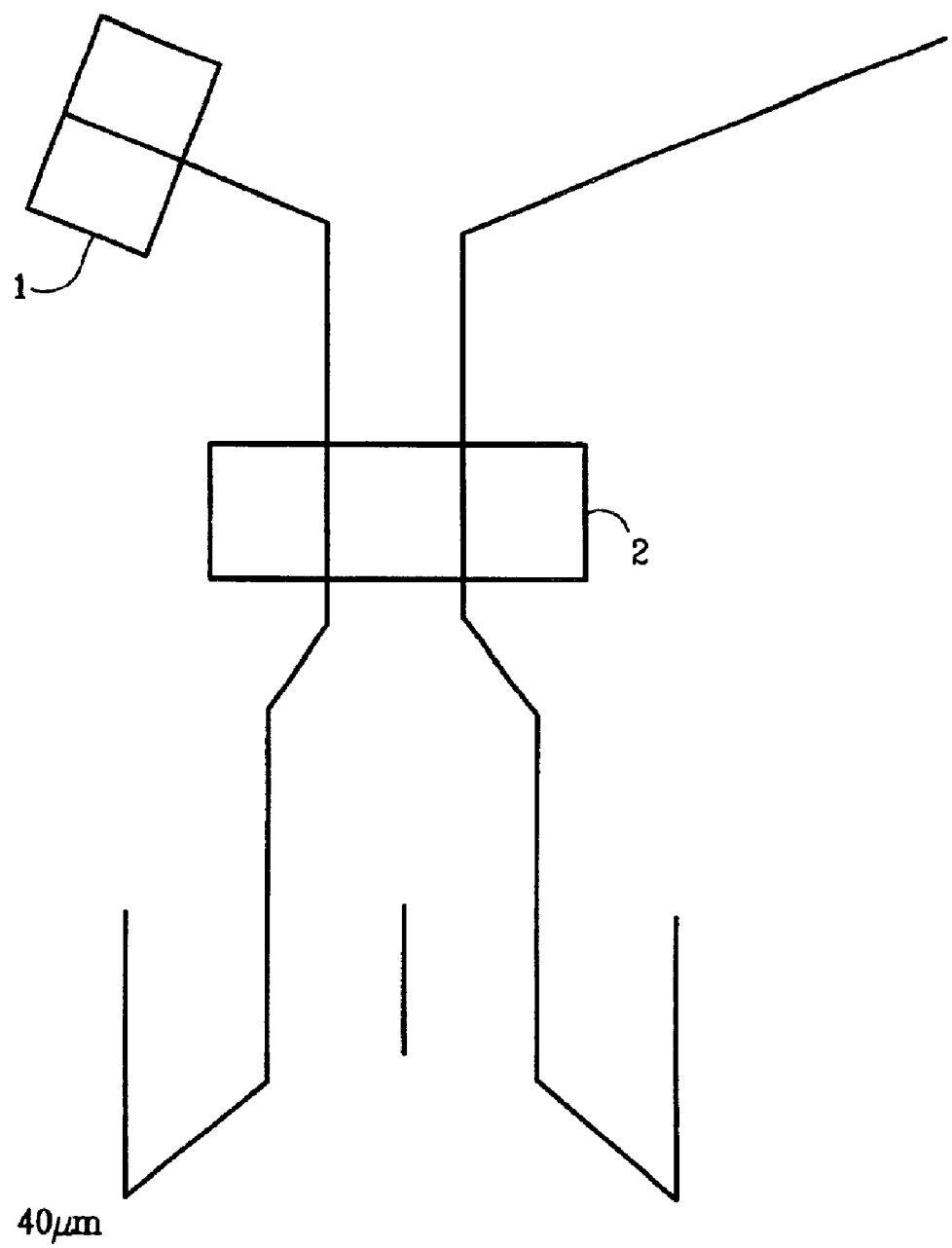
FIG. 11 is an optical micrograph of an exemplary sample that was analyzed using the invention.
Figure 12A:
FIGS. 12a, 12c, and 12e are graphs illustrating calculated force profiles
Figure 12B:
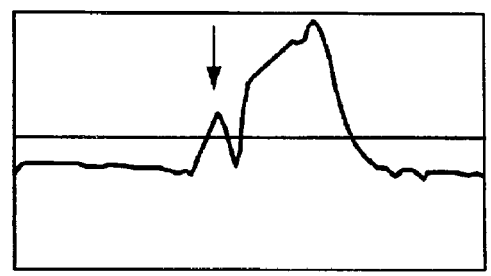
FIGS. 12b, 12d, and 12f are graphs illustrating measured force profiles using basic potential correction magnetic-force microscopy (PMFM) mode, obtained from the system of FIG. 1.
Figure 12C:
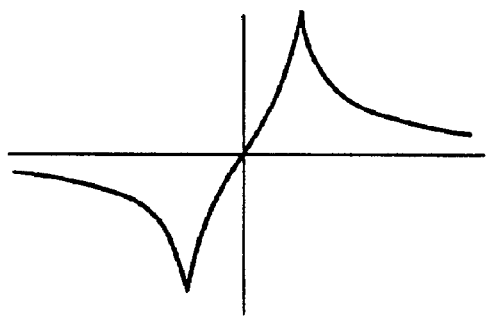
Figure 12D:
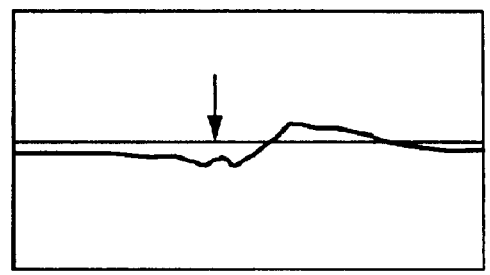
Figure 12E:
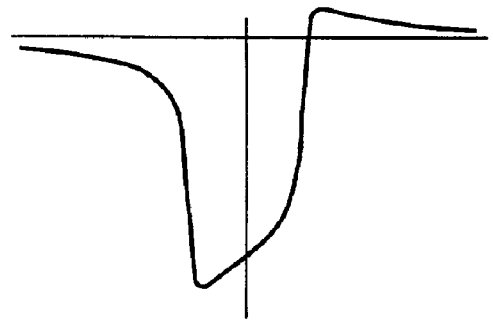
Figure 12F:
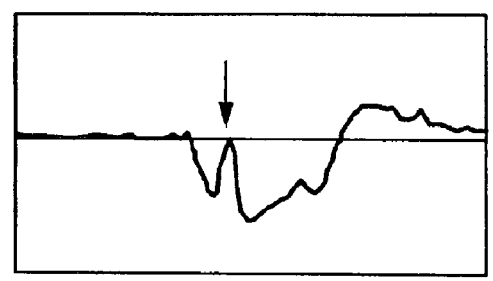

A first approach, referred to herein as basic PMFM mode, reduces the impact of the electrostatic interactions by adjusting the dc tip bias to a constant dc voltage to offset the electrostatic interaction between the tip and the surface of the sample. FIG. 11 is an optical micrograph of a sample to which this approach was applied. As shown in FIG. 11, area 1 is a single line area and area 2 is a double line area. FIGS. 12a through 12f shows graphical results of data taken from area 1 of the sample of FIG. 11 using the system of FIG. 1 and basic MFM mode. FIG. 12a illustrates a calculated force profile for area 1 of the sample and FIG. 12b illustrates a measured force profile using basic PMFM mode for a tip dc bias of −2 V. FIG. 12c illustrates a calculated force profile for area 1 of the sample and FIG. 12b illustrates a measured force profile using basic PMFM mode for a tip dc bias of 316 mV. FIG. 12e illustrates a calculated force profile for area 1 of the sample and FIG. 12f illustrates a measured force profile using basic PMFM mode for a tip dc bias of 2 V. The arrows indicate topographic artifacts that were not reproducible on the trace and retrace paths. It should be noted that the graphs of FIGS. 12a, 12b, 12e, and 12f each include both magnetic and electrostatic contributions. In the graphs of FIGS. 6c and 6d, however, electrostatic contributions are significantly reduced because they have been offset by the dc tip bias of 316 mV. This bias is referred to as the nulling bias because it corresponds to a theoretical minimal amount of electrostatic interaction between the tip and the surface.

Figure 13A:
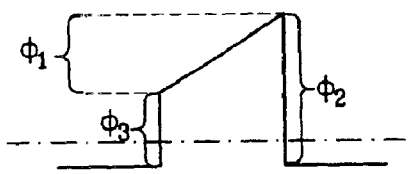
FIG. 13a is a graph of force versus distance illustrating a force profile, obtained from the system of FIG. 1.
Figure 13B:
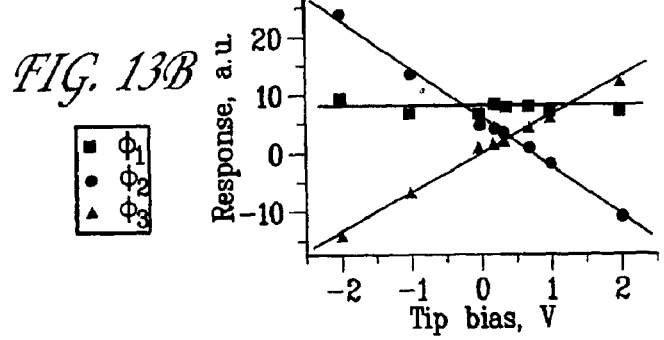
FIG. 13b is a graph of tip bias versus measured force illustrating tip bias dependence, obtained from the system of FIG. 1.
Figure 13C:
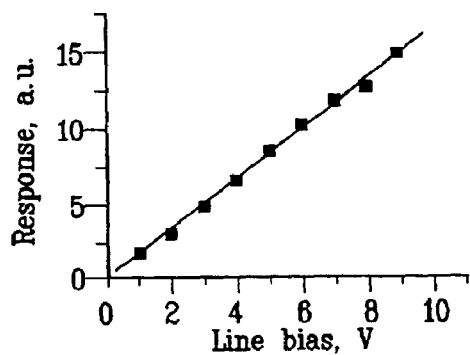
FIG. 13c is a graph of line bias versus measured force at a nulling tip bias, obtained from the system of FIG. 1.
Figure 13D:
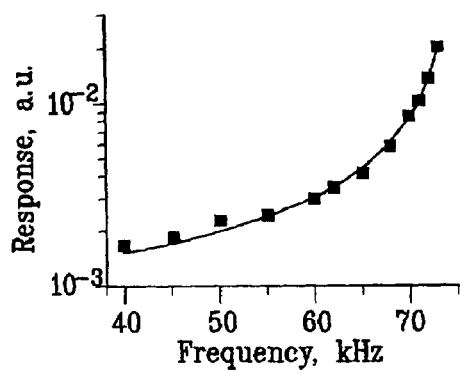
FIG. 13d is a graph of frequency versus measured force, obtained from the system of FIG. 1.

The magnetic and electrostatic components for basic PMFM mode are illustrated in FIGS. 13a through 13d. FIG. 13a is a graph of force versus distance that illustrates a force profile in basic PMFM mode where $\phi_1$ represents the magnetic contribution to the force, $\phi_2$ represents the capacitive interaction between the tip and the line, and $\phi_3$ represents the capacitive interaction between the tip and the sample. FIG. 13b is a graph for tip bias versus measured force that represents the tip bias dependence of $\phi_1$, $\phi_2$, and $\phi_3$. FIG. 13c is a graph of line bias versus measured force at the nulling bias. FIG. 13d is a graph of frequency versus measured force. The solid line was fitted according to Equations 9a and 9b.

Adjusting the tip bias, however, provides an average correction for capacitive contributions over the length of the sample. This can introduce errors to measurements of samples having non-uniform potentials over the length of the sample. To overcome this, local potentials can be determined with voltage modulation techniques, such as for example, scanning surface potential microscopy (SSPM). In SSPM, the tip is biased with a signal that can have both an ac and a dc component, as described by $V_{tip}=V_{dc}+V_{ac}\cos(\omega_r t)$, where $\omega_r$ is selected to be the resonant frequency of the cantilever to provide a strong mechanical response. The first harmonic of the force on the cantilever due to capacitance is given by Equation 12.

$$F_{1\omega}^{cap}(z) = \frac{\partial C(z)}{\partial z}(V_{dc}^{tip} - V_{surf})V_{ac}^{tip}\sin(\omega t) \qquad \text{Equation 16}$$

Using this relationship $V_{surf}$ is determined and feedback control is used to set the dc component of the tip to $V_{surf}$, thereby mapping and canceling the surface potential simultaneously. It is noteworthy that Equations 15 and 16 are similar, the difference being the second magnetic term of Equation 15.

FIGS. 14a through 14d illustrate experimental results using the above described technique. FIG. 14a is a graph of lateral sample distance for area 1 of the sample versus determined force with the tip biased at 316 mV. FIG. 14b is a graph of lateral sample distance for area 1 of the sample versus determined potential using SSPM with a line frequency of 70 kHz, a tip frequency (at the resonant frequency $\omega_r$) of 75.1679 kHz, and $V_{ac}$ of 5 V. FIG. 14c is a graph of lateral sample distance determined from the difference of the force and potential profiles of FIGS. 14a, 14b, respectively, using a phenomenological proportionality coefficient. As can be seen in FIG. 14c, topographical artifacts can be reduced. FIG. 14d is a graph of lateral sample distance versus force of experimental data measured using an ac bias applied to the tip at the resonant frequency of the cantilever while conventional SSPM techniques and feedback are used to match the dc bias of the tip to the determined surface potential.

PMFM may be implemented with three passes: a first pass measures the surface topography of the sample, a second pass measures the surface potential of the sample, and the third pass determines magnetic force data as a conventional MFM while the dc bias of the tip is adjusted based on the values determined in the second pass. Alternatively, PMFM may be implemented in one pass, wherein for each pixel along the path taken by the tip, the sample surface topography is measured, the surface potential is determined, and magnetic force data is determined with the dc bias of the tip adjusted based on the determined surface potential. Two pass implementations are also contemplated.

Portions of the invention may be embodied in the form of program code (i.e., instructions) stored on a computer-readable medium, such as a magnetic, electrical, or optical storage medium, including without limitation a floppy diskette, CD-ROM, CD-RW, DVD-ROM, DVD-RAM, magnetic tape, flash memory, hard disk drive, or any other machine-readable storage medium, wherein, when the program code is loaded into and executed by a machine, such as a computer, the machine becomes an apparatus for practicing the invention. When implemented on a general-purpose processor, the program code combines with the processor to provide a unique apparatus that operates analogously to specific logic circuits.

It is noted that the foregoing illustrations have been provided merely for the purpose of explanation and are in no way to be construed as limiting of the invention. While the invention has been described with reference to illustrative embodiments, it is understood that the words which have been used herein are words of description and illustration, rather than words of limitation. Further, although the invention has been described herein with reference to particular structure, methods, and embodiments, the invention is not intended to be limited to the particulars disclosed herein; rather, the invention extends to all structures, methods and uses that are within the scope of the appended claims. Those skilled in the art, having the benefit of the teachings of this specification, may effect numerous modifications thereto and changes may be made without departing from the scope and spirit of the invention, as defined by the appended claims.

What is claimed is:

1. A method for determining impedance information of an interface in a sample, the method comprising the steps of:
   (a) applying an ac voltage to the sample, laterally across the interface, the ac voltage having a predetermined frequency;
   (b) disposing a cantilevered tip in a first position proximate to a surface of the sample;
   (c) measuring a first response of the cantilevered tip with the cantilevered tip in the first position;
   (d) placing the cantilevered tip in a second position proximate to the surface of the sample, the interface being between the first position and the second position;
   (e) measuring a second response of the cantilevered tip with the cantilevered tip in the second position; and (f) determining impedance information of the interface based upon the measured first response and the measured second response.

2. The method as recited in claim 1, wherein the step of:
measuring a first response comprises measuring a first phase angle of deflection of the cantilevered tip;
measuring a second response comprises measuring a second phase angle of deflection of the cantilevered tip; and
determining impedance information comprises:
   determining a phase shift based upon the first phase angle and the second phase angle; and
   determining impedance information of the interface based upon the phase shift and the frequency of the ac voltage.

3. The method as recited in claim 2, wherein the step of determining impedance information further comprises determining an impedance product of the interface according to:

$$\tan(\varphi_{gb}) = \frac{\omega C_{gb} R_{gb}^2}{(R+R_{gb}) + R\omega^2 C_{gb}^2 R_{gb}^2}$$

where $C_{gb}$ is the capacitance of the interface;
$R_{gb}$ is the resistance of the interface;
$\omega$ is the frequency of the ac voltage;
$\phi_{gb}$ is the phase shift; and
R is a resistance of a current limiting resistor in series with the sample.

4. The method as recited in claim 2, further comprising the step of:
selecting the frequency $\omega$ of the ac voltage such that $\tan(\omega_{gb})$ is proportional to $\omega^{-1}$; and
wherein the step of determining impedance information further comprises determining the capacitance of the interface according to:

$$\tan(\varphi_{gb}) = \frac{1}{\omega R C_{gb}}$$

where $C_{gb}$ is the capacitance of the interface;
$\omega$ is the frequency of the ac voltage;
$\phi_{gb}$ is the phase shift; and
R is a resistance of a current limiting resistor in series with the sample.

5. The method as recited in claim 2, further comprising the step of:
selecting the frequency $\omega$ of the ac voltage such that $\tan(\phi_{gb})$ proportional to $\omega$; and
wherein the step of determining impedance information further comprises determining the resistance of the interface according to:

$$\tan(\varphi_{gb}) = \frac{\omega C_{gb} R_{gb}^2}{(R+R_{gb})}$$

where $R_{gb}$ is the resistance of the interface;
$C_{gb}$ is the capacitance of the interface;
$\omega$ is the frequency of the ac voltage;
$\phi_{gh}$ is the phase shift; and
R is a resistance of a current limiting resistor in series with the sample.

6. The method as recited in claim 1, wherein the step of:
measuring a first response comprises measuring a first amplitude of deflection of the cantilevered tip;
measuring a second response comprises measuring a second amplitude of deflection of the cantilevered tip; and
determining impedance information comprises:
   determining an amplitude ratio based upon the measured first amplitude and the measured second amplitude; and
   determining an impedance of the interface based upon the amplitude ratio and the frequency of the ac voltage.

7. The method of claim 6, wherein the step of determining the impedance further comprises determining the impedance according to:

$$\beta^{-2} = \frac{\{(R+R_{gb}) + R\omega^2 C_{gb}^2 R_{gb}^2\}^2 + \omega^2 C_{gb}^2 R_{gb}^4}{R^2(1+\omega^2 C_{gb}^2 R_{gb}^2)^2}$$

where $\beta$ is amplitude ratio across the interface,
$C_{gb}$ is the capacitance of the interface,
$R_{gb}$ is the resistance of the interface,
$\omega$ is the frequency of the ac voltage, and
R is a resistance of a current limiting resistor in series with the sample.

8. The method as recited in claim 1, wherein the step of:
measuring a first response comprises the steps of:
   measuring a first phase angle of deflection of the cantilevered tip; and
   measuring a first amplitude of deflection of the cantilevered tip;
measuring a second response comprises:
   measuring a second phase angle of deflection of the cantilevered tip; and
   measuring a second amplitude of deflection of the cantilevered tip; and
determining impedance information comprises:
   determining a phase shift based upon the measured first phase angle and the measured second phase angle;
   determining an amplitude ratio based upon the measured first amplitude and the measured second amplitude; and
   determining an impedance of the interface based upon the phase shift and the amplitude ratio.

9. The method as recited in claim 8, wherein the step of determining an impedance of the interface comprises solving the following equations:

$$\beta^{-2} = \frac{\{(R+R_{gb}) + R\omega^2 C_{gb}^2 R_{gb}^2\}^2 + \omega^2 C_{gb}^2 R_{gb}^4}{R^2(1+\omega^2 C_{gb}^2 R_{gb}^2)^2}$$

$$\tan(\varphi_{gb}) = \frac{\omega C_{gb} R_{gb}^2}{(R+R_{gb}) + R\omega^2 C_{gb}^2 R_{gb}^2}$$

where $\beta$ is amplitude ratio across the interface,
$C_{gb}$ is the capacitance of the interface,
$R_{gb}$ is the resistance of the interface,
$\phi_{gb}$ is the phase shift;
$\omega$ is the frequency of the ac voltage, and
R is a resistance of a current limiting resistor in series with the sample.

10. The method as recited in claim 8, further comprising the steps of:

repeating each step of claim 8, for each of a predefined plurality of ac voltage frequencies; and determining an impedance of the interface as a function of frequency based upon the determined phase shifts and amplitude ratios.

11. The method as recited in claim 8 wherein the step of determining an impedance further comprises determining the impedance of the interface based upon the phase shift and amplitude ratio and the frequency of the ac voltage by using the circuit termination comprised of average resistive and capacitive components determined by conventional impedance spectroscopy by measuring the frequency dependence of phase angle or measuring phase angle and amplitude ratio at a single frequency with a least square fit procedure.

12. The method as recited claim 8 further comprising the steps of:

repeating each step of claim 8 and applying a first dc signal laterally across the interface while performing each measuring step;

repeating each step of claim 8 and applying a second dc signal laterally across the interface while performing each measuring step; and determining dc signal bias dependence of the interface resistance and capacitance based upon the first and second dc signal.

\* \* \* \* \*